(12) United States Patent
Fitzgerald et al.

(10) Patent No.: US 7,217,668 B2
(45) Date of Patent: May 15, 2007

(54) GATE TECHNOLOGY FOR STRAINED SURFACE CHANNEL AND STRAINED BURIED CHANNEL MOSFET DEVICES

(75) Inventors: Eugene A. Fitzgerald, Windham, NH (US); Richard Hammond, Cardiff (GB); Matthew Currie, Brookline, MA (US)

(73) Assignee: AmberWave Systems Corporation, Salem, NH (US)

( * ) Notice: Subject to any disclaimer, the term of this patent is extended or adjusted under 35 U.S.C. 154(b) by 0 days.

(21) Appl. No.: 11/013,838

(22) Filed: Dec. 16, 2004

(65) Prior Publication Data

US 2005/0202640 A1 Sep. 15, 2005

Related U.S. Application Data

(63) Continuation of application No. 10/421,154, filed on Apr. 23, 2003, now Pat. No. 6,846,715, which is a continuation of application No. 09/923,207, filed on Aug. 6, 2001, now Pat. No. 6,583,015.

(60) Provisional application No. 60/223,595, filed on Aug. 7, 2000.

(51) Int. Cl.
  *H01L 21/31* (2006.01)
  *H01L 21/469* (2006.01)
  *H01L 21/336* (2006.01)

(52) U.S. Cl. .............. 438/763; 438/285; 438/287; 257/E21.409; 257/E21.129

(58) Field of Classification Search .......... 438/763, 438/285, 689, 287, 151; 257/E21.409, E21.129, 257/E21.445
See application file for complete search history.

(56) References Cited

U.S. PATENT DOCUMENTS

| | | | |
|---|---|---|---|
| 5,166,084 A | * | 11/1992 | Pfiester ............... 438/151 |
| 5,212,110 A | | 5/1993 | Pfiester et al. |
| 5,981,400 A | | 11/1999 | Lo |
| 6,074,919 A | | 6/2000 | Gardner et al. |
| 6,096,590 A | | 8/2000 | Chan et al. |
| 6,103,559 A | | 8/2000 | Gardner et al. |
| 6,111,267 A | | 8/2000 | Fischer et al. |
| 6,154,475 A | * | 11/2000 | Soref et al. ............. 257/19 |
| 6,162,688 A | | 12/2000 | Gardner et al. |
| 6,191,432 B1 | | 2/2001 | Sugiyama et al. |
| 6,194,722 B1 | | 2/2001 | Fiorini et al. |
| 6,207,977 B1 | | 3/2001 | Augusto |
| 6,210,988 B1 | | 4/2001 | Howe et al. |
| 6,218,677 B1 | | 4/2001 | Broekaert |

(Continued)

OTHER PUBLICATIONS

Abramo A., et al., "Mobility Simulation of a Novel Si/SiGe FET Structure," IEEE Electron Device Letters, vol. 17, No. 2, pp. 59-61 (1996).

(Continued)

*Primary Examiner*—Walter L. Lindsay, Jr.
(74) *Attorney, Agent, or Firm*—Goodwin Procter, LLP

(57) ABSTRACT

A method of fabricating a semiconductor device including providing a semiconductor heterostructure, the heterostructure having a relaxed $Si_{1-x}Ge_x$ layer on a substrate, a strained channel layer on the relaxed $Si_{1-x}Ge_x$ layer, and a $Si_{1-y}Ge_y$ layer; removing the $Si_{1-y}Ge_y$ layer; and providing a dielectric layer. The dielectric layer includes a gate dielectric of a MISFET. In alternative embodiments, the heterostructure includes a SiGe spacer layer and a Si layer.

16 Claims, 12 Drawing Sheets

U.S. PATENT DOCUMENTS

| | | | |
|---|---|---|---|
| 6,350,993 | B1 | 2/2002 | Chu et al. |
| 6,407,406 | B1 | 6/2002 | Tezuka |
| 2004/0171223 | A1* | 9/2004 | Hammond et al. ......... 438/285 |
| 2005/0003229 | A1* | 1/2005 | Bedell et al. ............... 428/641 |

OTHER PUBLICATIONS

Mizuno, T. et al., "Electron and Hole Mobility Enhancement in Strained-Si MOSFETs on SiGe-on-Insulator Substrates Fabricated by SIMOX Technology," IEE Electron Device Letters, vol. 21, No. 5, (2000).

O'Neill, A.G., et al., "Deep Submicron CMOS Based on Silicon Germanium Technology," IEEE Transactions on Electron Devices. vol. 43, No. 6, pp. 911-918 (1996).

Welser, J., et al., "Evidence of Real-Space Hot-Electron Transfer in High Mobility, Strained-Si Multilayer MOSFETs," IEEE IEDM Tech. Dig., pp. 545-548 (1993).

Welser, J. et al., "NMOS and PMOS Transistors Fabricated in Strained Silicon/Relaxed Silicon-Germanium Structures," IEEE IEDM Tech. Dig., pp. 1000-1002 (1992).

Armstrong, "Technology for SiGe Heterostructure-Based CMOS Devices," Ph.D. Thesis, Massachusetts Institute of Technology, Department of Electrical Engineering and Computer Science (Jun. 30, 1999).

Wolf, Silicon Processing for the VLSI Era vol. 2: Process Integration, Lattice Press, Sunset Beach, CA, pp. 27, 331 (1990).

Comments to Patent Owner's Response, *In re* reexamination of U.S. Patent No. 6,846,715, Nov. 27, 2006, 15 pages.

Request for Inter Partes Reexamination Pursuant to 35 U.S.C. §§ 301-318 and 37 C.F.R. § 1.913 of U.S. Appl. No. 6,846,715, Jun. 26, 2006.

International Search Report for PCT Application No. PCT/US01/24614, dated Mar. 11, 2002, 3 pages.

Hellberg, P.E., et al. "Oxidation of Silicon-Germanium Alloys. I. An experimental study" Journal of Applied Physics, vol. 82, No. 11, pp. 5773-5778, Dec. 1, 1997.

Niino, Takeo and Tatsumi, Toru "SiGe Passivation for Si MBE Regrowth" Japanese Journal of Applied Physics, vol. 29, No. 9, pp. L 1702-L 1704, Sep. 1990.

Wu, Y.H. et al., "High-quality Thermal Oxide Grown on high-Temperature-Formed SiGe," Journal of the Electrochemical Society, vol. 147, No. 5, pp. 1962-1964, 2000.

Notice of Assignment of *Inter Partes* Reexamination Request, Patent No. 6,846,715, Jul. 27, 2006.

Office Action in *Inter Partes* Reexamination, Patent No. 6,846,715, Aug. 30, 2006.

Order Granting/Denying Request for *Inter Partes* Reexamination, Patent No. 6,846,715, Aug. 30, 2006.

\* cited by examiner

GATE TECHNOLOGY FOR STRAINED SURFACE CHANNEL AND STRAINED BURIED CHANNEL MOSFET DEVICES

PRIORITY INFORMATION

This application is a continuation of U.S. Ser. No. 10/421,154, filed Apr. 23, 2003, now U.S. Pat. No. 6,846,715 which is a continuation of U.S .Ser. No. 09/923,207, filed Aug. 6, 2001, now U.S. Pat. No. 6,583,015, which claims priority from and the benefit of U.S. provisional application Ser. No. 60/223,595 filed Aug. 7, 2000, the entire disclosure of each application being incorporated herein by reference.

BACKGROUND OF THE INVENTION

The invention relates to gate technology for strained surface channel and strained buried channel MOSFET devices.

The advent of high quality relaxed SiGe layers on Si has resulted in the demonstration of field effect transistors (FETs) with carrier channels enhanced via strain. The strain can be incorporated in the channel due to the lattice mismatch between the channel and the relaxed SiGe created by a change in the Ge concentration between the channel layer and the relaxed SiGe layer. For example, a Ge concentration of 20% Ge in the relaxed buffer is high enough such that a thin strained Si layer can exhibit electron mobilities as high as 1000–2900 cm$^2$/V-sec. Also, if the Ge concentration in the channel is greater than the concentration in the buffer, hole channel mobilities can be enhanced. For example, a relaxed buffer concentration of 60–70% Ge can compressively strain a Ge channel layer, creating potentially extremely high hole mobilities.

Although the exact physics of carrier scattering are not known inside short-channel FETs, one thing is clear: these enhanced mobilities translate into increased device performance, even at very short gate lengths. In addition to higher speed and a different power-delay product, the use of strained channels allows for the incorporation of new FET structures into Si-based circuits. Thus, it is anticipated that the high performance, new flexibility in device design, and economics of using a Si-based platform will lead to a plethora of new circuits and products.

With regards to these new circuits and products, the devices based on metal-insulator-semiconductor (MIS) or metal-oxide-semiconductor (MOS) gate technology are the most intriguing, since these devices can follow very closely the processes already used in Si VLSI manufacturing. Two main types of devices are of particular interest: the surface channel device and the buried channel device, examples of which are shown in FIGS. 1A and 1B.

FIG. 1A is a cross section of a block diagram of a strained Si surface channel device 100, in which a thin strained Si layer 102 is grown atop a relaxed SiGe virtual substrate. The SiGe virtual substrate can be relaxed SiGe 104 on a SiGe graded buffer 105 (as shown in FIG. 1a), relaxed SiGe directly on a Si substrate 106, or relaxed SiGe on an insulator such as SiO$_2$. The device also includes a SiO$_2$ layer 108 and gate material 110.

FIG. 1B is a cross section of a block diagram of a strained Si buried channel device 112, in which a SiGe layer 116 and a second strained Si layer 120 (used for gate oxidation) cap the strained Si channel layer 114. The structure also includes a graded SiGe buffer layer 125 and a second relaxed SiGe layer 126. In both device configurations, a gate oxide 122 is grown or deposited and the gate material 124 is deposited to form the (MOS) structure. Although only devices with strained Si channels are shown in FIGS. 1A and 1B, the invention is applicable to any heterostructure device fabricated on a relaxed SiGe platform. For example, the heterostructure strained channel could be Ge or SiGe of a different Ge content from that of the underlying SiGe virtual substrate. However, the following description will focus on the applicability of the invention to the strained Si device variants illustrated in FIGS. 1A and 1B.

In order to form the MOS gate of the heterostructure device, the SiGe would ideally be oxidized directly in the buried channel device, and the strained Si would be oxidized directly in the surface channel device. Unfortunately, there are problems due to the nature of the Si/SiGe heterostructures in both cases that render the direct oxidation process unsatisfactory.

First consider the surface channel device. Since Si is being oxidized, the interface state density at the resulting SiO$_2$/Si interface is low, and an electrically high quality interface results. However, all oxidation and cleaning processes during the device and circuit fabrication consume the Si material. In conventional Si processing, there is generally little worry about Si consumption since so little material is consumed compared to any limiting vertical dimension early in the fabrication process. However, in the case of the strained surface channel FET described here, the top strained Si layer is typically less than 300 Å thick, and thus too much Si consumption during cleaning and oxidation steps will eliminate the high mobility channel.

One obvious solution is to simply deposit extra Si at the surface, planning for the removal of the Si that occurs during processing. However, the channel strain, which gives the channel its higher carrier mobility, limits the Si layer thickness. At a great enough thickness, the Si layer will begin to relax, introducing misfit dislocations at the Si/SiGe interface. This process of dislocation introduction has two deleterious effects on device performance. First, the strain in the Si is partially or completely relieved, potentially decreasing the carrier mobility enhancements. Second, dislocations can scatter carriers, decreasing carrier mobility. Dislocations can also affect device yield, reliability, and performance.

The buried channel case appears to be a better situation at first, since the Si layer thickness is buried. However, in this case, direct oxidation of SiGe creates a very high interface state density at the oxide/SiGe interface, leading to poor device performance. A known solution in the field is to create a thin Si layer at the surface of the buried channel structure. In this structure, the surface layer is carefully oxidized to nearly consume the entire top Si layer. However, a thin layer of un-oxidized Si is left so that the interface to the oxide is the superior SiO$_2$/Si interface rather than the problematic oxide/SiGe interface. Although this sacrificial surface Si layer solves the interface electronic property issue, the structure now has the same limits as the structure described above, i.e., the sacrificial Si layer will be slowly etched away during Si processing, possibly leading to exposure of the SiGe and degradation of the electrical properties of the interface as described.

SUMMARY OF THE INVENTION

In accordance with the invention there is provided a method of fabricating a semiconductor device including providing a semiconductor heterostructure, the heterostructure having a relaxed Si$_{1-x}$Ge$_x$ layer on a substrate, a strained channel layer on the relaxed Si$_{1-x}$Ge$_x$ layer, and a Si$_{1-y}$Ge$_y$ layer; removing the Si$_{1-y}$Ge$_y$ layer; and providing a dielectric layer. The dielectric layer includes a gate dielectric of a MISFET. In alternative embodiments, the heterostructure includes a SiGe spacer layer and a Si layer.

DETAILED DESCRIPTION OF THE INVENTION

To eliminate the issue of losing valuable surface Si, an innovative step that has not been previously considered can be employed. In fact, any interest in this area is dominated by discussions of how to change the Si device and circuit process to conserve Si consumption. Although these are certainly possibilities, such constraints severely limit process flexibility, alter the process further from the conventional Si process, and most likely will increase the cost of the fabrication process.

A solution for the buried channel and surface channel structures is to actually deposit another SiGe layer after the desired device structure (which, in the buried channel heterostructure, includes the sacrificial Si layer for oxidation). The structures are shown in FIGS. 2A and 2B.

Figure 2A:
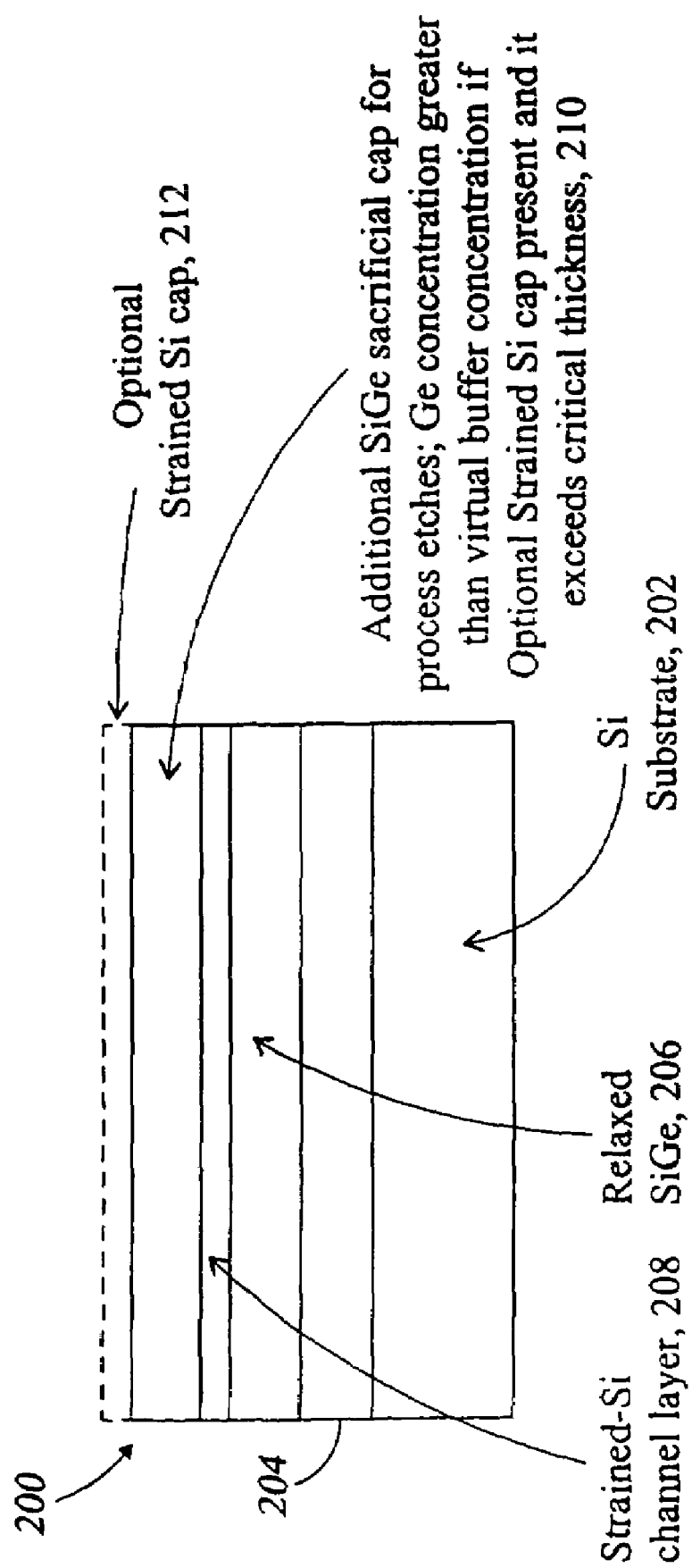
FIGS. 2A and 2B are cross sections of block diagrams of starting heterostructures for surface channel and buried channel strained MOS, respectively, in accordance with the invention.
Figure 2B:
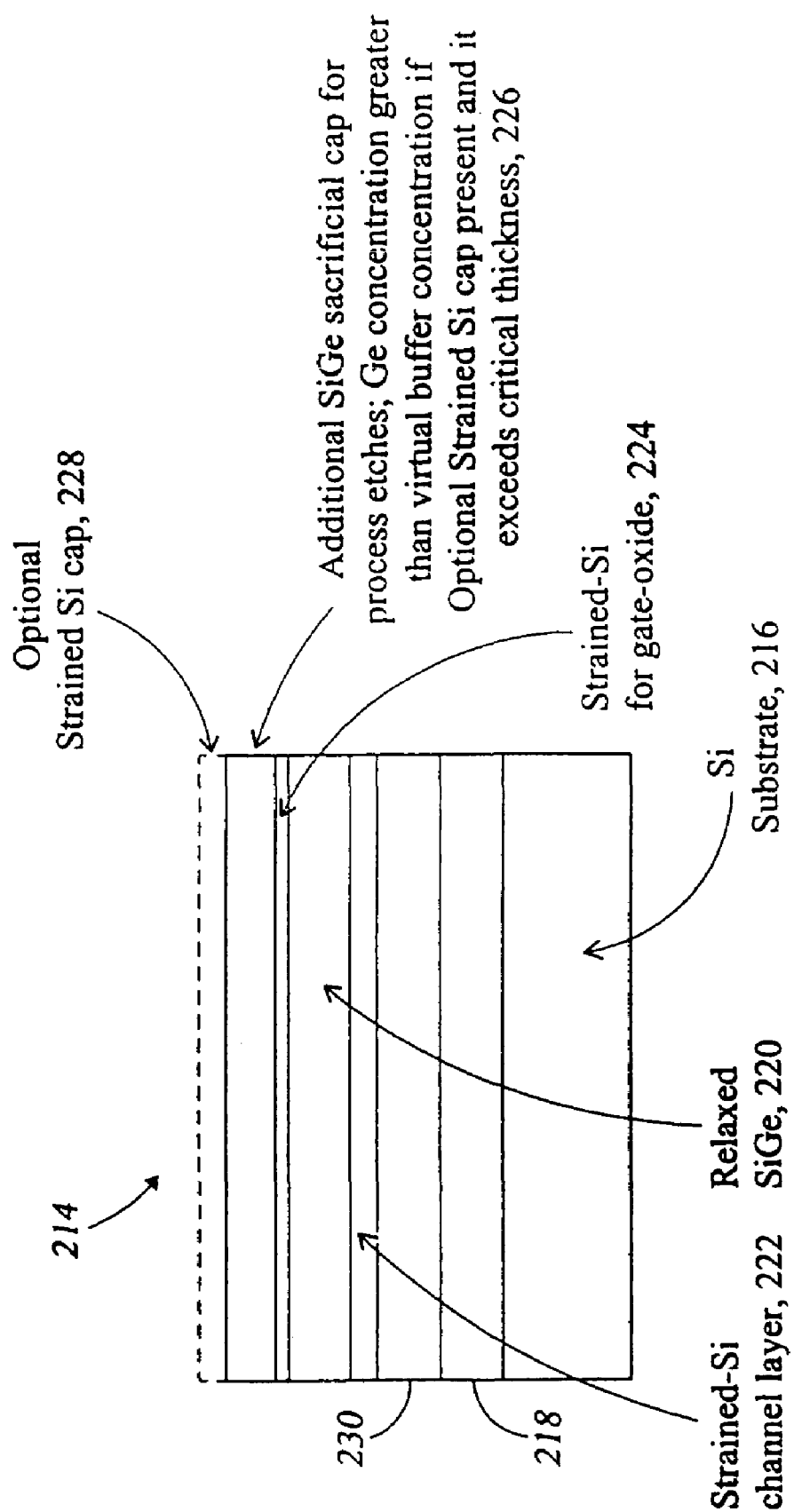

FIG. 2A is a cross section of a block diagram of a starting heterostructure 200 for surface channel strained MOS in accordance with the invention. The structure 200 includes a Si substrate 202, a SiGe graded buffer 204, a relaxed SiGe layer 206, and a strained-Si channel layer 208. FIG. 2B is a cross section of a block diagram of a starting heterostructure 214 for buried channel strained Si MOS. The structure 214 includes a Si substrate 216, a SiGe graded buffer 218, relaxed SiGe layers 220 and 230, a first strained-Si channel layer 222 and a second strained-Si layer 224 for the gate oxide.

Figure 1A:
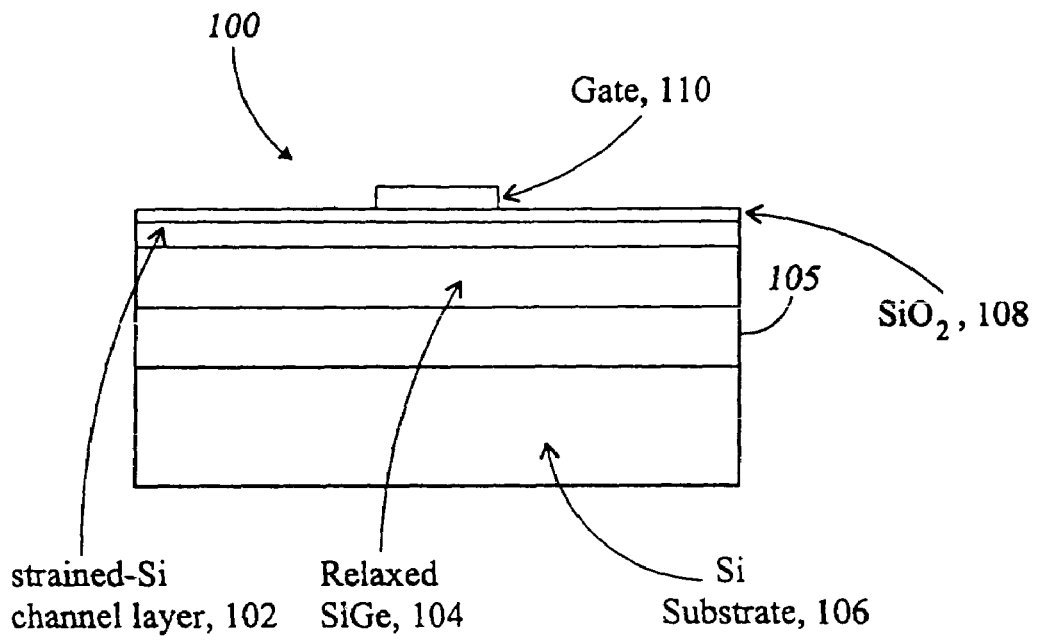
FIGS. 1A and 1B are cross sections of block diagrams of strained Si surface and buried channel devices, respectively.
Figure 1B:
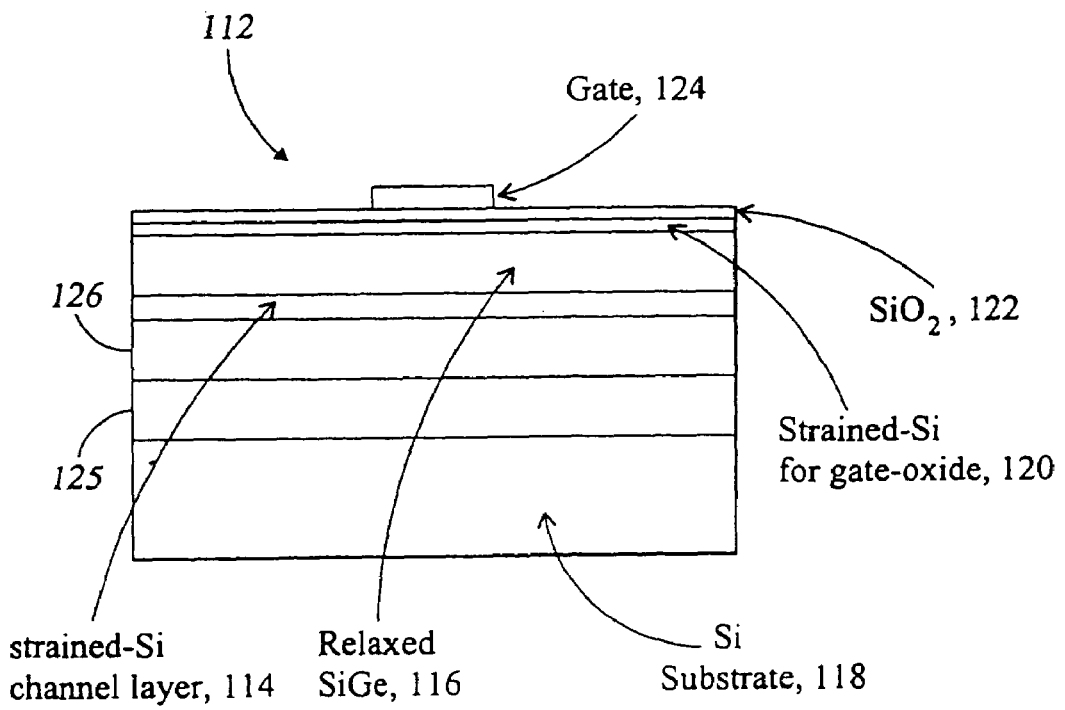

These structures are identical to those depicted in FIGS. 1A and 1B before the gate stack formation, except for the addition of a SiGe capping layer 210, 226 and an optional Si capping layer 212, 228. Since the SiGe layer 210, 226 is closely lattice-matched to the relaxed SiGe layers below the device layers, there is essentially no limit on the thickness of the SiGe layer. This SiGe layer thickness can be tuned to the thickness of material removed before gate oxidation, so that the strained Si layer is exposed just before oxidation. Alternatively, the SiGe can be thicker than the removal thickness and then can be selectively removed. In fact, as described below, SiGe can be selectively removed with respect to Si using a variety of conventional Si-based processes. Therefore, cleaning and oxidation steps can be performed during the Si device and circuit fabrication process with little worry of consuming the precious strained Si and/or the sacrificial strained Si. One only needs to create a SiGe thick enough such that it is not totally consumed before the critical gate oxidation step.

An additional option can be to place yet another Si layer 212, 228 on top of the additional SiGe layer 210, 226. In some processing facilities, the idea of SiGe on the surface, instead of Si, is a factor for concern. In this case, another Si layer can be deposited on top of the additional SiGe layer described above. By choosing the Ge concentration in the additional SiGe layer to be greater than that of the virtual buffer, a compressive layer can be created; thus, if this additional optional Si layer is greater than the critical thickness, there is no possibility of dislocations moving into the device layers. This phenomenon occurs since the Si layers are tensile, and therefore dislocations introduced into the top optional Si layer have a Burgers vector that will not allow them to glide favorably in the compressive layer below. The dislocations in the top optional Si layer (if the Si layer critical thickness is exceeded) will not penetrate into the layers beneath it, and therefore as much Si can be deposited as desired. In fact, this optional Si capping layer need not be strained at all in this case and can serve as a protective sacrificial layer even if it is fully relaxed.

Figure 3A:
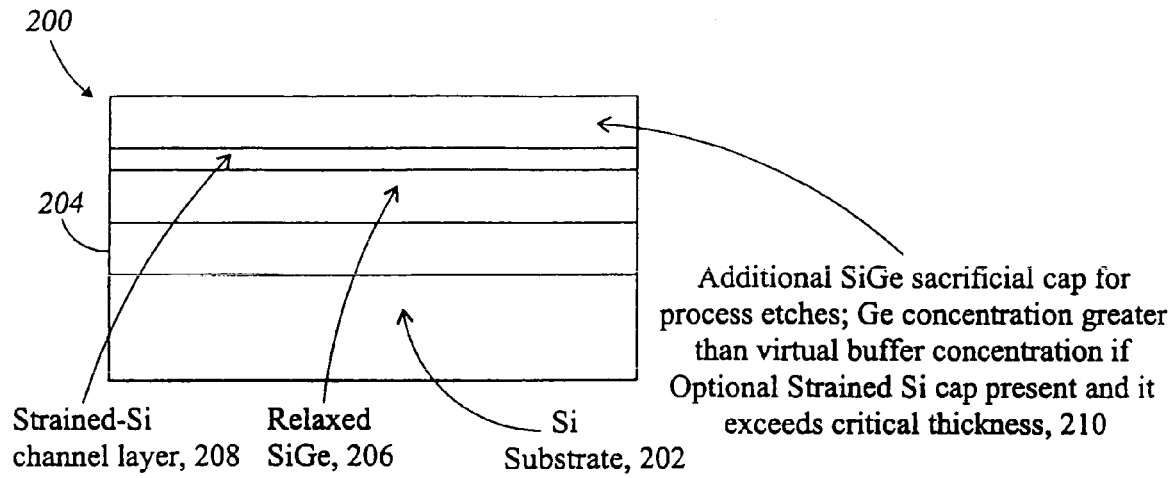
FIGS. 3A–3D are block diagrams showing the process sequence for a strained surface channel MOS device.
Figure 3B:
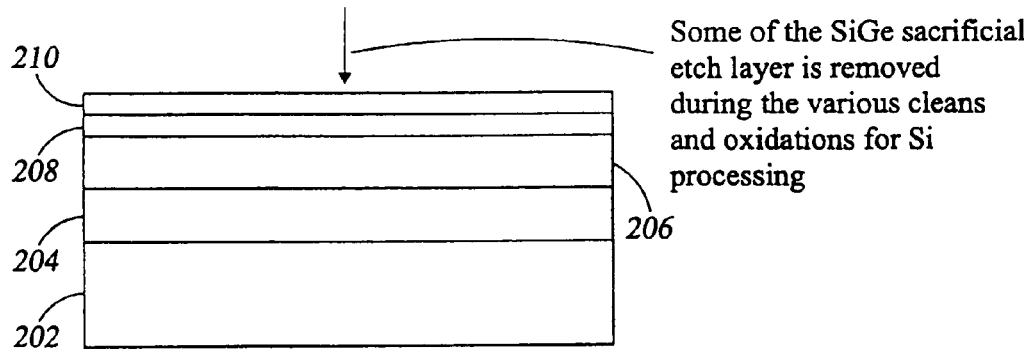

FIGS. 3A–3D are block diagrams showing the process sequence for a strained surface channel MOS device utilizing the gate structure described above (the process is shown for a structure without an optional strained surface layer). FIG. 3A shows the initial Si/SiGe heterostructure 200 shown in FIG. 2A. FIG. 3B shows the structure after the completion of the initial steps of a Si VLSI process, which could include wet chemical cleans and oxidation steps. Thus, in FIG. 3B, the protective SiGe capping layer 210 has been reduced in thickness, as a portion of the layer has been consumed during processing. Next, the remainder of the protective SiGe capping layer 210 is selectively removed, leaving the underlying Si layer 208 intact and exposed. A sacrificial oxidation step and oxide strip can also be performed at this point to improve the quality of the exposed Si surface.

Figure 3C:
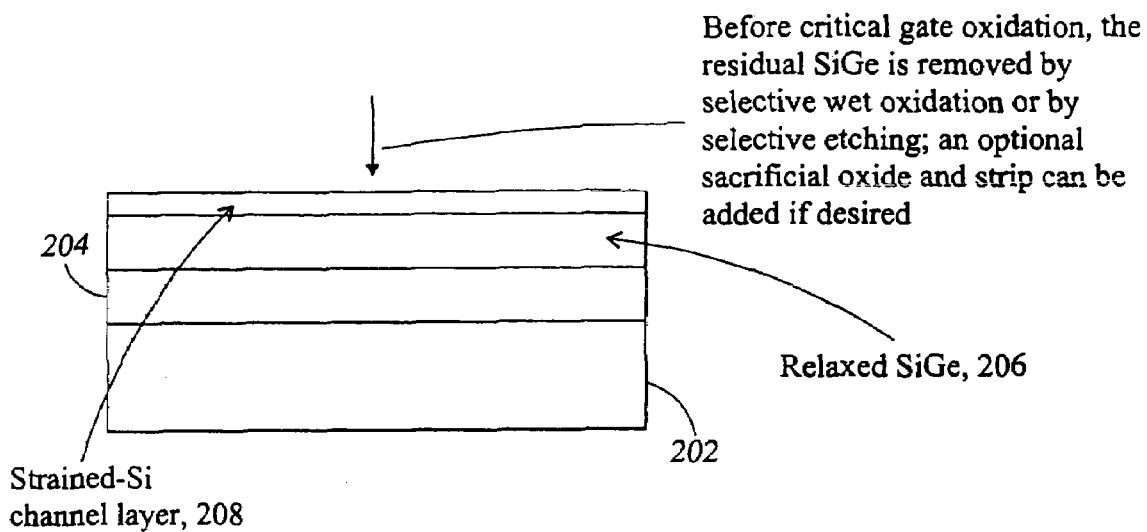
Figure 3D:
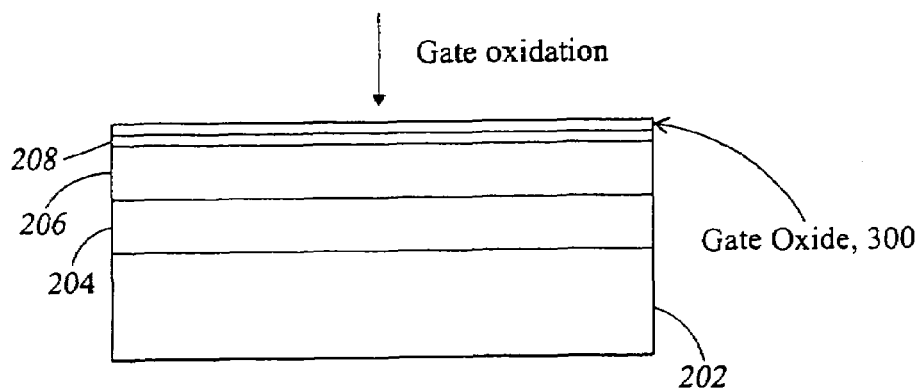
Figure 4A:
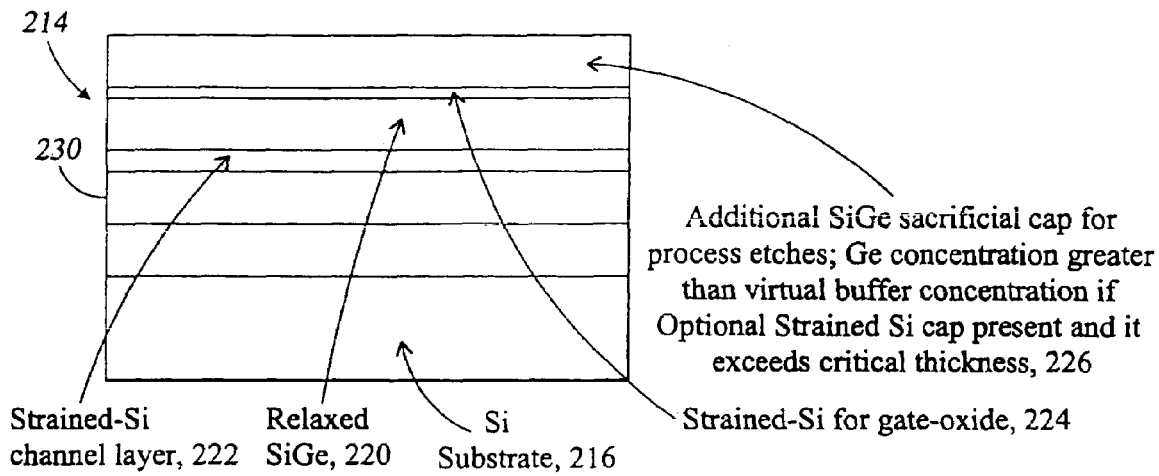
FIGS. 4A–4D are block diagrams showing the process sequence utilizing the gate structure for a buried channel device.
Figure 4B:
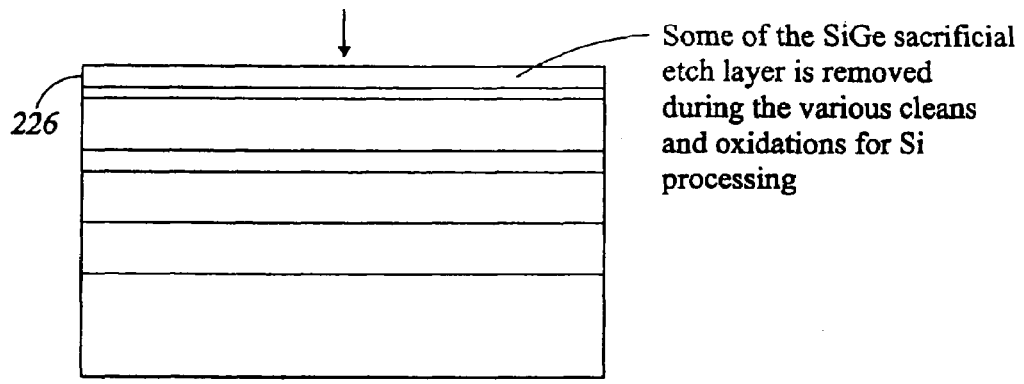
Figure 4C:
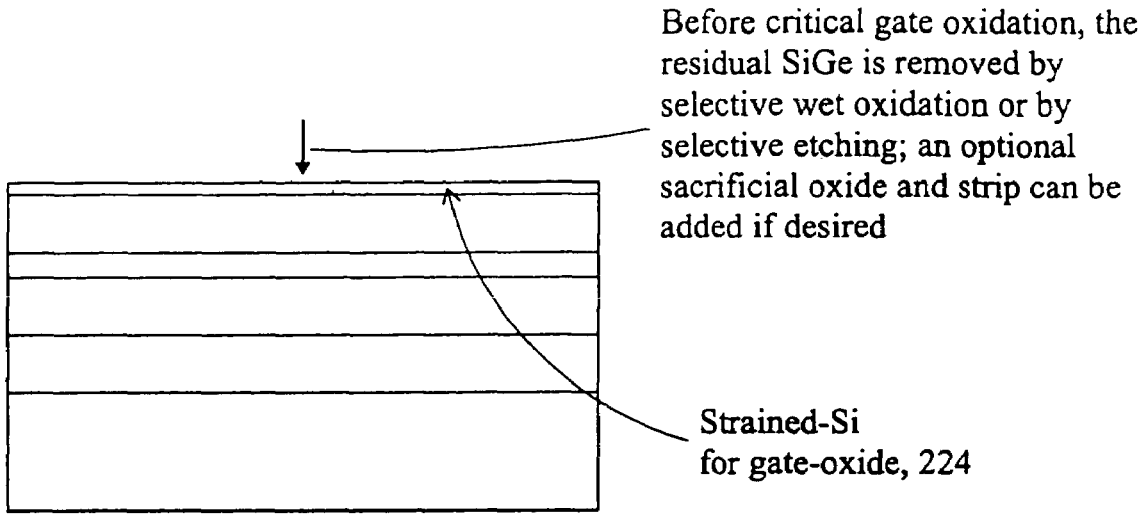
Figure 4D:
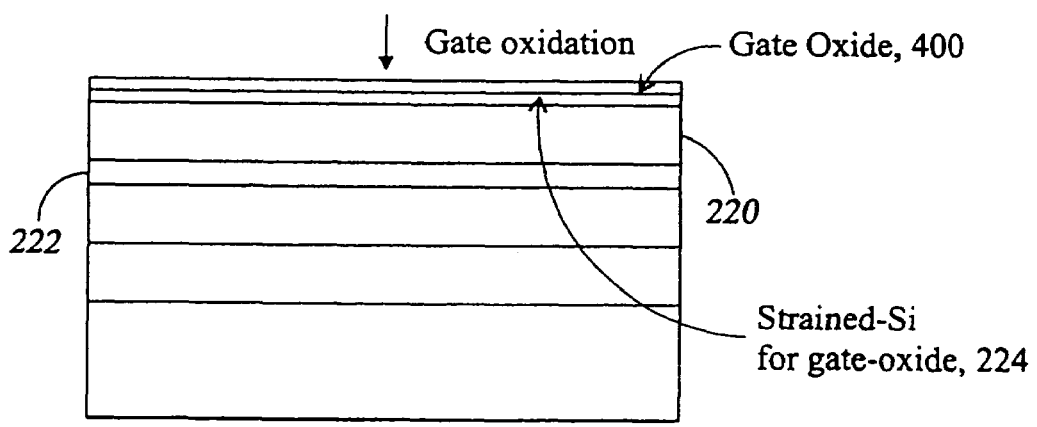

The resulting structure is shown in FIG. 3C. FIG. 3D shows the final device structure after gate oxidation to form a gate oxide 300, a structure in which the minimum possible amount of Si was consumed prior to the gate oxidation step. Alternatively, at this point an alternate gate dielectric could be deposited on the exposed Si surface. A pristine Si surface is just as important for a high quality interface with many deposited gate dielectrics as it is for a thermally grown $SiO_2$ gate dielectric.

FIGS. 4A–4D are block diagrams showing the process sequence utilizing the gate structure for a buried channel device (the process is shown for a structure without an optional strained surface layer) using the initial Si/SiGe heterostructure 214 shown in FIG. 2B. The process steps are identical to those of FIGS. 3A–3D, but in the final heterostructure, the Si channel layer 222 is separated from the gate dielectric 400 by a SiGe spacer layer 220, thus forming a buried channel. Using selective processes to etch down to the buried Si channel or the top Si layer can use the starting heterostructure 214 in FIG. 4A to form a surface channel device. Such a process can result in enhancement mode and depletion mode devices that can in turn be used to create E/D logic circuits as well as a plethora of analog circuits.

In both sequences, an exemplary sequence of steps is: 1. Pre-gate-oxidation cleaning steps and oxidation; 2. Selective etch or oxidation to remove residual protective SiGe layer; 3. Sacrificial oxide formation on Si; 4. Sacrificial oxide strip: 5. Gate oxidation.

It will be appreciated that steps 3 and 4 can be optional, depending on whether there may be a small amount of Ge left on the surface after the selective removal of the SiGe protection layer. When the original heterostructure is grown, the SiGe/Si interface will not be infinitely abrupt, and therefore it is possible to have a small amount of Ge in the optimally pure Si layer. A sacrificial oxide step can be employed to remove an additional small amount of the Si layer to ensure that pure Si is oxidized in the gate oxidation step, ensuring high quality gate oxide.

The second step, the selective removal of the residual SiGe protective material, can be accomplished in a variety of ways. One convenient process is a wet oxidation step, preferably at 750° C. or below. Under wet oxidation at these temperatures, SiGe is oxidized at rates that can be 100 times greater than rates oxidizing Si under the same conditions. Thus, in order to expose the Si for gate oxidation, one can simply do a wet oxidation of the SiGe layer and selectively stop at the Si layer. The oxidized SiGe can be stripped to expose the Si. It is important to note here that the low temperature is not only important for the selectivity in the oxidation process, but also the low temperature is important to minimize or prevent the snow-plowing of Ge in front of the oxidation front, a known problem in the direct oxidation of SiGe.

Figure 5:
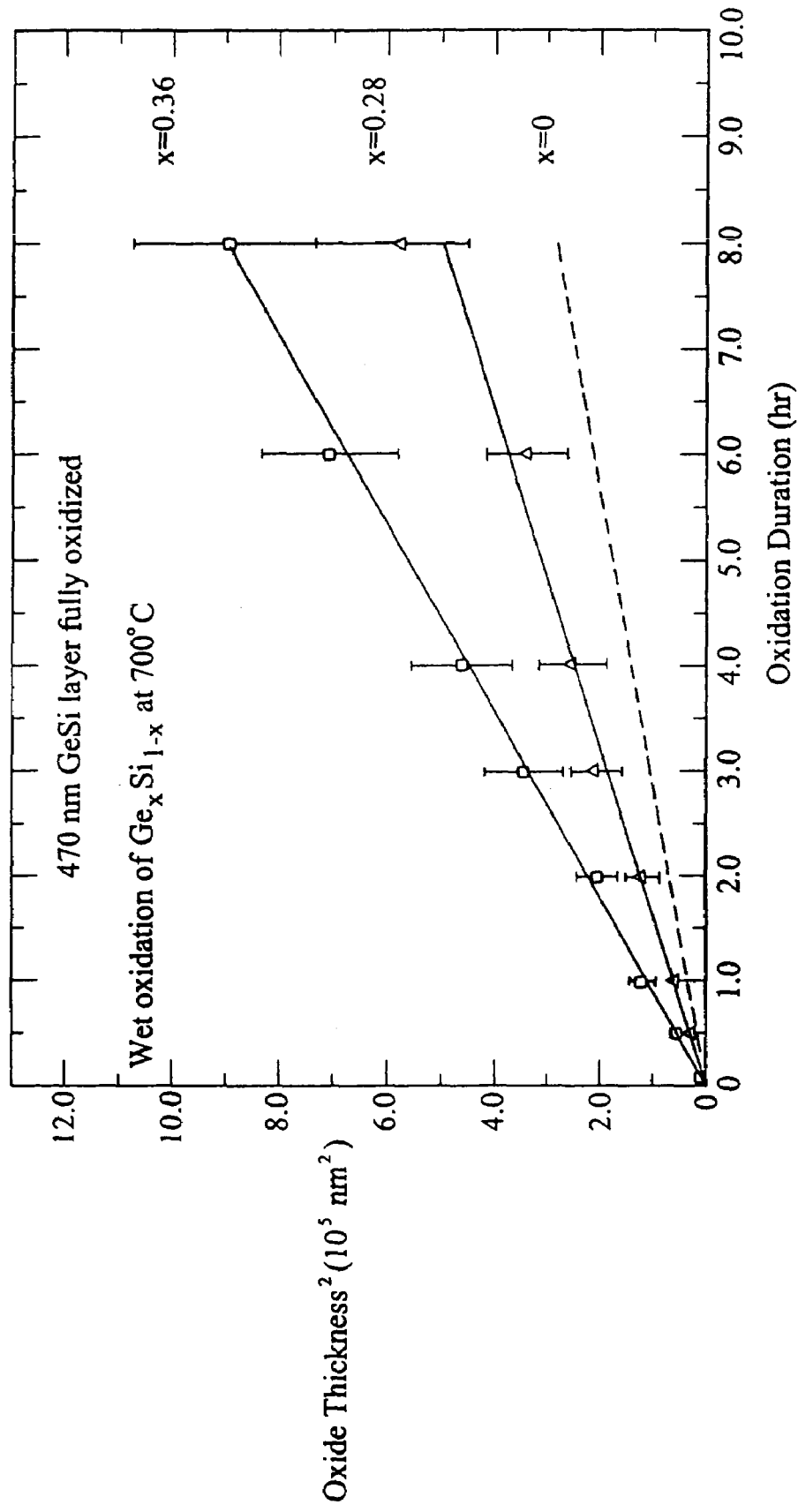
FIG. 5 is a graph of oxidation rates, under a wet oxidation ambient at 700° C., of SiGe alloys, with Ge contents of 0.28 and 0.36, compared to the oxidation rate of bulk silicon.

FIG. 5 is a graph of oxidation rates, under a vet oxidation ambient at 700° C., of SiGe alloys, with Ge contents of 0.28 and 0.36, compared to the oxidation rate of bulk silicon. It is evident from the graph that, under such conditions, the oxidation rate of SiGe increases as the Ge content of the film increases.

Figure 6:
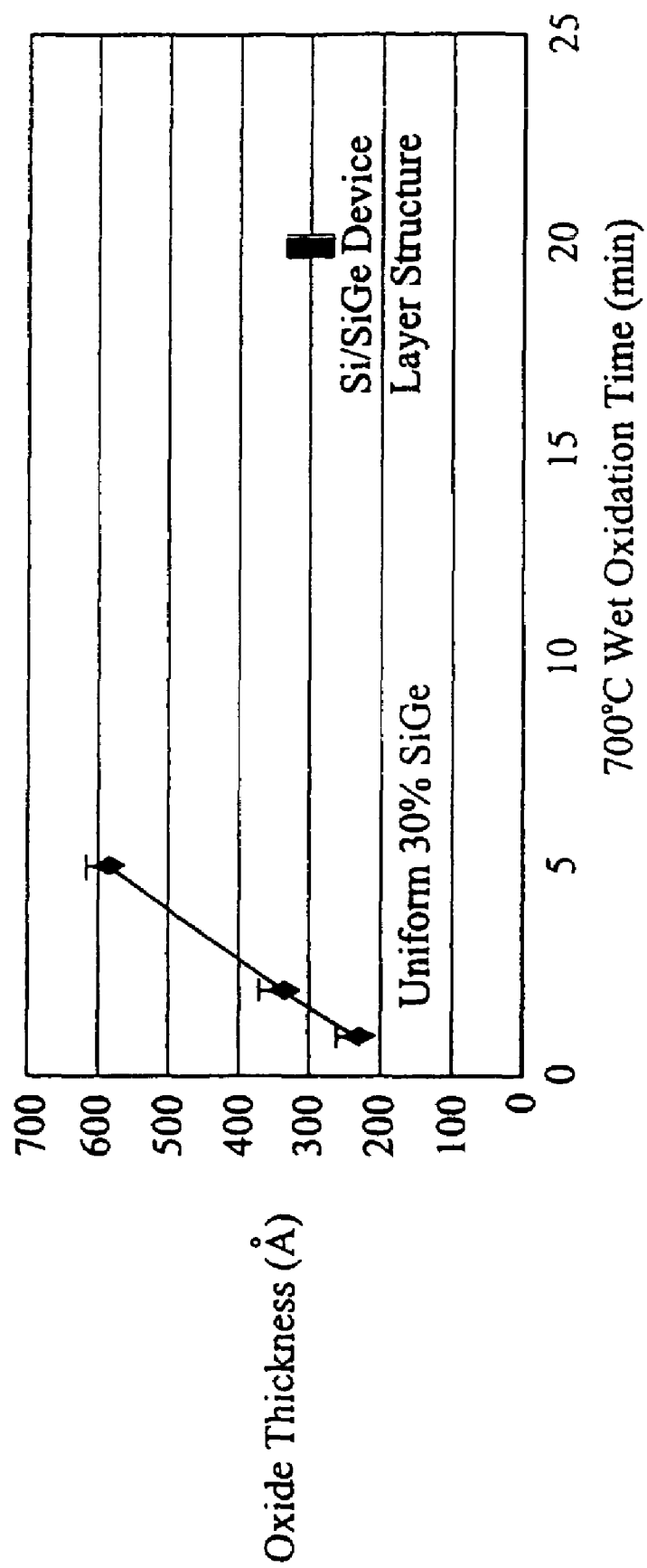
FIG. 6 is a graph showing the oxide thickness of both a $Si_{0.7}Ge_{0.3}$ alloy and a $Si/Si_{0.7}Ge_{0.3}$ heterostructure.

FIG. 6 is a similar graph, showing the oxide thickness of both a $Si_{0.7}Ge_{0.3}$ alloy and a $Si/Si_{0.7}Ge_{0.3}$ heterostructure. Again, the oxidation conditions were 700° C. in a wet ambient; however, FIG. 6 depicts very short oxidation durations compared to FIG. 5. The $Si/Si_{0.7}Ge_{0.3}$ heterostructure consists of a 50 Å strained Si buried layer, followed by a 30 Å $Si_{0.7}Ge_{0.3}$, a 20 Å strained Si layer and finally a 50 Å $Si_{0.7}Ge_{0.3}$ capping layer.

Figure 7:
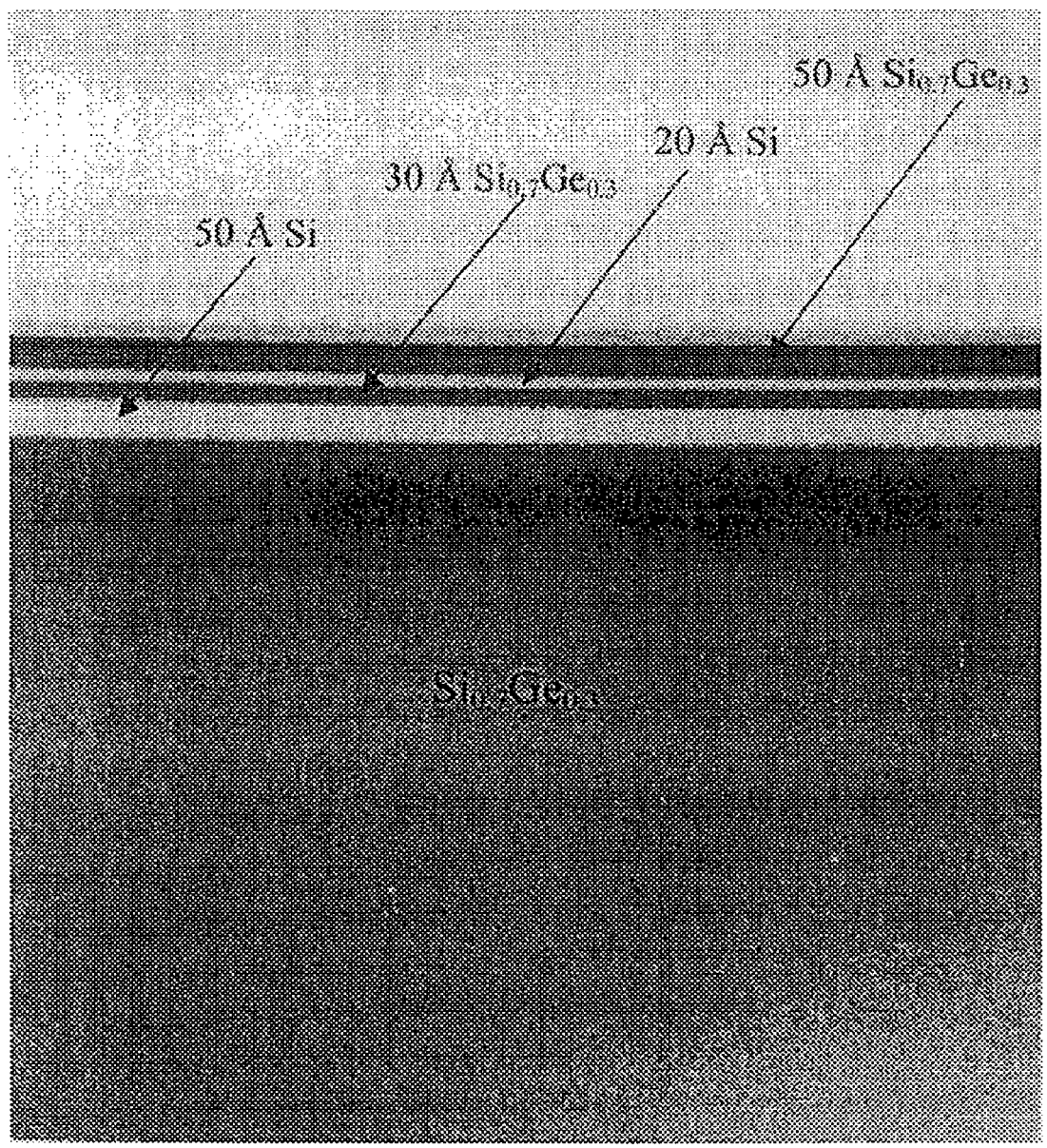
FIG. 7 is a cross-sectional transmission electron micrograph (XTEM) of the $Si/Si_{0.7}Ge_{0.3}$ heterostructure.

A cross-sectional transmission electron micrograph (XTEM) of the $Si/Si_{0.7}Ge_{0.3}$ heterostructure is shown in FIG. 7. It should be noted from FIG. 6 that the presence of strained Si layers in the heterostructure results in a dramatic retardation in the oxidation rate when compared to the oxidation rate of the uniform $Si_{0.7}Ge_{0.3}$. This retardation of the oxidation rate forms the basis of the selective removal of SiGe alloys over strained Si epitaxial layers.

Figure 8:
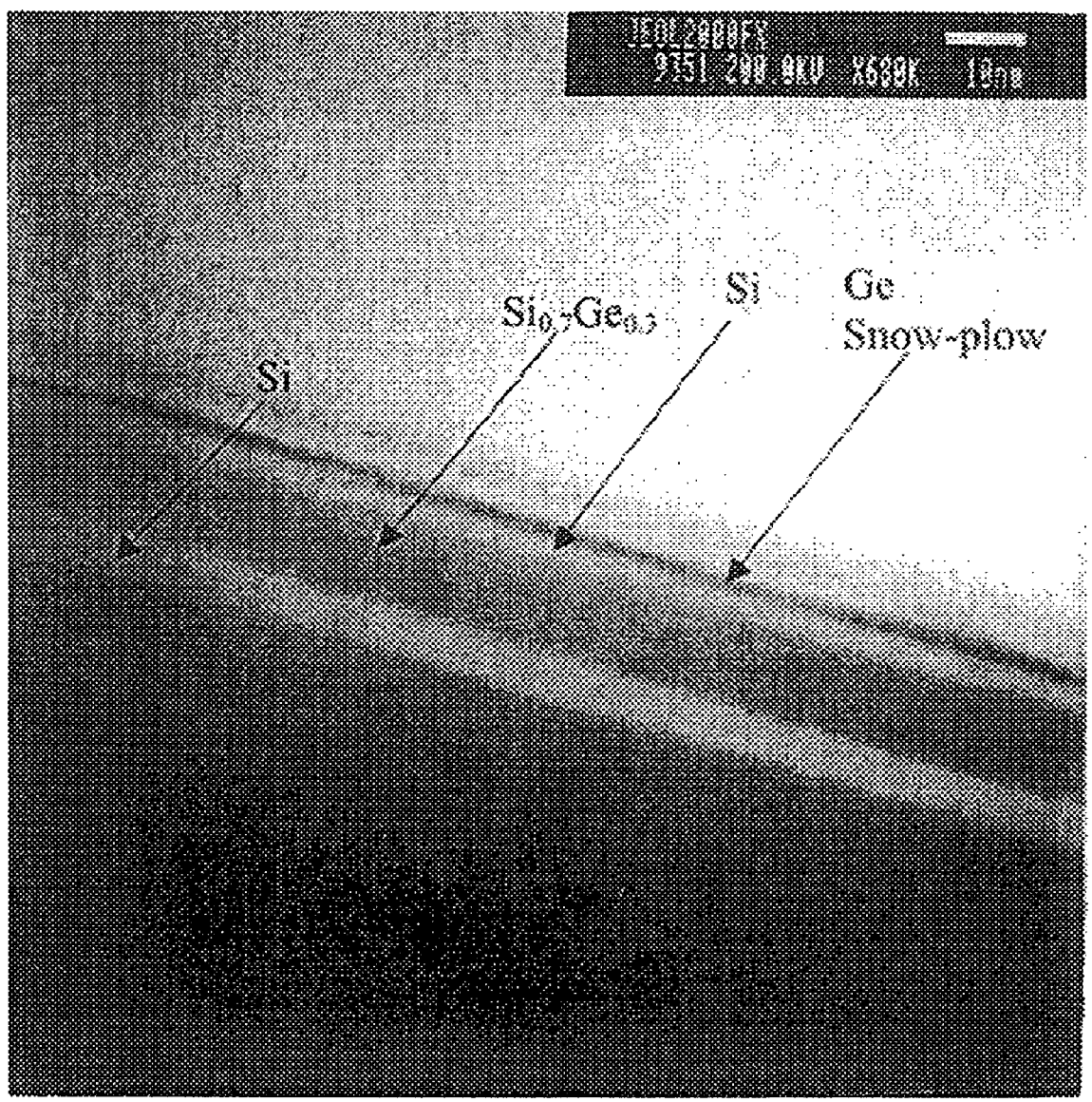
FIG. 8 is a XTEM image of the identical $Si/Si_{0.7}Ge_{0.3}$ heterostructure after wet oxidation followed by oxide removal via a wet etch.

FIG. 8 is a XTEM image of the identical $Si/Si_{0.7}Ge_{0.3}$ heterostructure after wet oxidation at 700° C. for 2 minutes followed by oxide removal via a wet etch. It is apparent that the thin strained Si layer is unaffected by the selective oxidation and remains fully intact. Based on the data shown in FIG. 5, an oxidation duration of 2 minutes far exceeds that required to fully oxidize the 50 Å $Si_{0.7}Ge_{0.3}$ capping layer of the heterostructure. The very thin dark band, which is apparent on the surface of the strained Si layer, is a snow-plowed high Ge content layer that occurs during oxidation. Such a layer may be removed using a simple chemical clean or a sacrificial oxidation step, either or both of which typically occur prior to the formation of the gate oxide.

Alternatively, the protective SiGe capping layer can be removed via selective dry or wet chemical etching techniques. For example, at high pressures (>200 mT) and low powers, $CF_4$ dry etch chemistries wilt etch relaxed SiGe films with high selectivity to Si. Mixtures of hydrofluoric acid (HF), hydrogen peroxide ($H_2O_2$), and acetic acid ($CH_3COOH$) will also selectively etch relaxed SiGe layers over Si at selectivities of 300:1 or more. Other potential selective wet chemical mixtures include HF, water ($H_2O$), and either $H_2O_2$ or nitric acid ($HNO_3$).

Additionally, the stability of the entire structure can be improved by increasing the Ge concentration in the intermediate SiGe layer, and also the top SiGe layer if desired. Below, energetic calculations are used to reveal a guide to creating semiconductor layer structures that increase stability with respect to misfit dislocation introduction.

The critical thickness for a buried channel MOSFET using relaxed SiGe and strained Si has been determined using the energy-balance formulation. The structure considered is the one shown in FIG. 9. The structure 900 includes a 30% SiGe virtual substrate 902 topped by a 80 Å strained Si layer 904, a SiGe layer with Ge concentration x2 and thickness h2 906, and an additional 30 Å of strained Si 908. Additional stability would result from the addition of an additional SiGe cap layer as described previously. To simplify, the example of FIG. 9 considers only the increased stability created by increasing the Ge concentration (x2) or thickness (h2) of the SiGe intermediate layer. Additionally, since the SiGe cap layer is removed during processing, the stability of the heterostructure with the SiGe cap removed is or primary importance.

In device processing, one must consider the critical thickness of the entire structure with respect to the relaxed virtual substrate. Individual layers that exceed the individual critical thicknesses are not explicitly ruled out, so one practicing the art would have to verify that none of the layers that are introduced into the desired structure exceed the individual layer critical thicknesses. In other words, in the following calculation it is assumed that each layer in the structure is below its critical thickness with respect to the relaxed buffer.

One key to the formulation is to realize that this calculation should be done with respect to the plastic deformation of the layer composite, δ. Then, the dislocation array energy is the same expression regardless of the layer structure. The elastic energy in the individual layers is changed because of δ. In tensile layers, the strain is lowered by δ. In compressive layers, the energy is raised by δ.

Thus, the energy for a dislocation array (per unit area) inserted at the base of the composite is:

$$E_\delta = 2\delta D(1-\nu \cos \alpha)[\ln(h_T/b)+1]$$

where $h_T$ is the total thickness of the composite ($h_1+h_2+h_3$), α is the angle between the dislocation line and the Burgers vector b, ν is the Poisson ratio, and D is the average shear modulus for a dislocation lying at the interface between the virtual substrate and the composite structure.

The total elastic energy (per unit area) in all the layers is:

$$E_t = \sum_{i=1}^{3} Y\varepsilon_i^2 h_i$$

where Y is the Young's modulus. Thus, the total energy of the system is:

$$E_T = E_\delta + E_e.$$

The energy can now be minimized with respect to δ (if the energy is lowest with no dislocations, then δ will have a less than or equal to zero value). The value of plastic deformation then is (for the 3 layer example):

$$\delta = \frac{f_1 h_1}{h_T} - \frac{f_2 h_2}{h_T} + \frac{f_3 h_3}{h_T} - \frac{D(1-\upsilon\cos^2\alpha)\left[\ln\left(\frac{h_T}{b}\right)+1\right]}{Y h_T}$$

The examination of this solution reveals that a general formulation for any structure would be (for any structure of n layers):

$$\delta = \sum_i^n \frac{f_i h_i}{h_T} - \frac{D(1-\upsilon\cos^2\alpha)\left[\ln\left(\frac{h_T}{b}\right)+1\right]}{Y h_T}$$

where f has been assigned a negative value for compressive layers and positive value for tensile layers, and $h_T$ is the total thickness of the structure:

$$h_T = \sum_i^n h_i.$$

Figure 9:
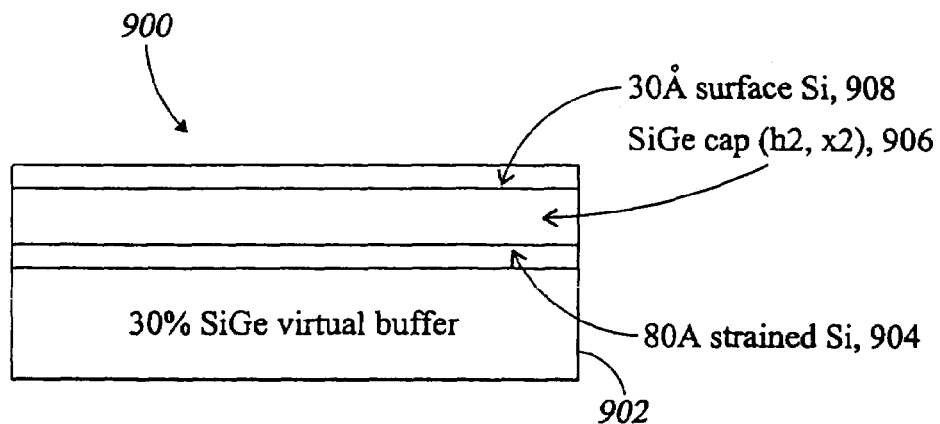
FIG. 9 is a structure for a buried channel MOSFET using relaxed SiGe and strained Si in accordance with the invention.

The amount of plastic deformation and resulting misfit dislocation spacing S was calculated for the structure depicted in FIG. 9 as follows:

Lower strained Si layer thickness h1=80 Å
Upper strained Si layer thickness h3=30 Å
Middle SiGe layer thickness h2 variable
Middle SiGe layer Ge concentration x2 variable
Virtual substrate GC concentration: 30%

Figure 10:
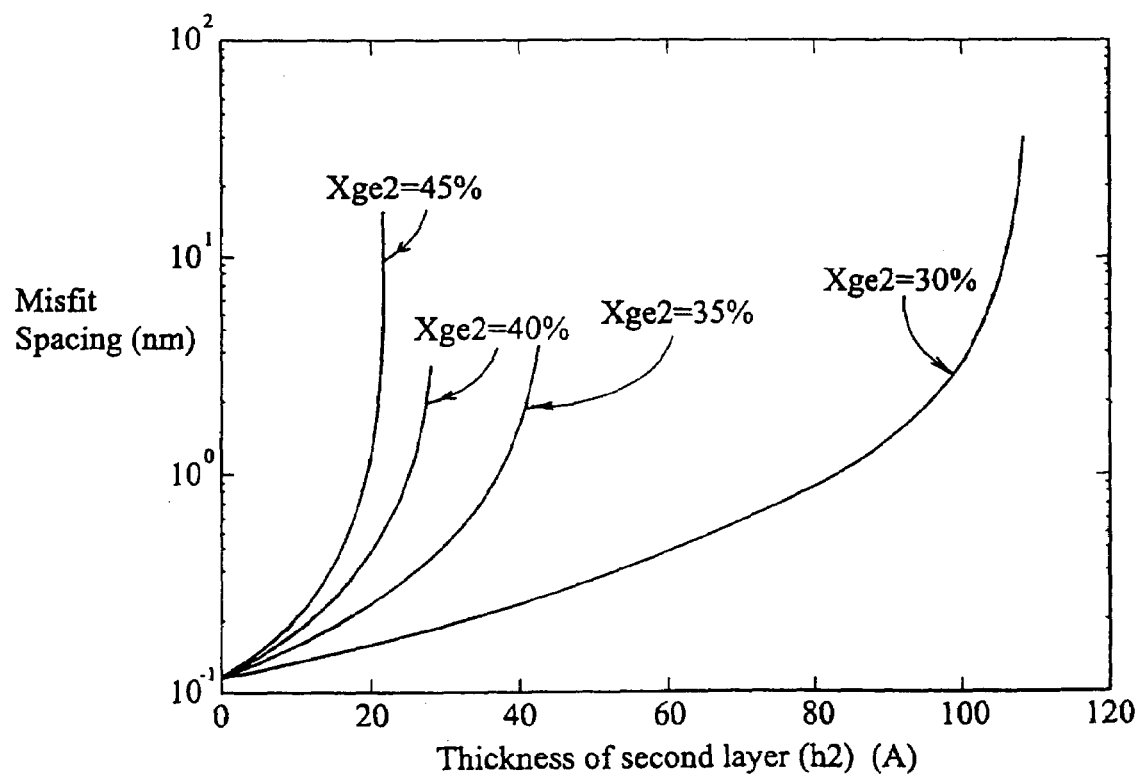
FIG. 10 is a graph showing a plot of the middle SiGe layer thickness (h2) and the resulting misfit dislocation spacing.

FIG. 10 is a graph showing a plot of the middle SiGe layer thickness (h2) and the resulting misfit dislocation spacing. The sharp upturn on the plots represents the critical thickness h2 of the middle SiGe layer when the entire composite structure destabilizes and introduces dislocations at the channel/virtual buffer interface. The different curves are for the different compositions in the second layer h2. Very small increases in Ge result in a large jump in stability of the device layers. This suggests that it is possible to stabilize the layer significantly but not have the band structure altered that much. Adding an extra 5–10% Ge into the h2 layer increases the stability drastically. For example, FIG. 10 indicates that over 100 Å of 30% Ge is required to provide the stability of a 20 Å layer of 45% Ge content.

Increasing h2 even when the h2 layer is lattice-matched to the virtual buffer increases the stability of the multilayer structure. In the equations above, the effect can be seen to be much weaker than when a compressive strain in h2 is created. When f2 is zero due to lattice matching to the virtual buffer, the increased stability with increasing h2 comes from the fact that $h_t$ is increasing and therefore decreasing δ (and increasing S).

It will be appreciated that all the calculations are equilibrium calculations, and as usual, one might suspect that these numbers are somewhat conservative, although also consider that the layers possess many threading dislocations that can bend over at the critical thickness, so there are plenty of sources for misfit dislocation generation.

Sacrificial SiGe capping layers provide an innovative method for the protection of thin strained device layers during processing. Such layers shield these critically important strained channel layers from process steps, such as wet chemical cleans and oxidations, which consume surface material. Before the growth or deposition of the gate dielectric, these protective SiGe layers can be selectively removed by standard processes such as oxidation or wet etching, revealing the intact strained device layer. Also presented is a guideline for engineering strained layer stacks such that relaxation via misfit dislocation is prevented. Compressively strained intermediate layers increase the stability of tensile channel layers, and also serve as a barrier for misfit dislocation introduction into the underlying layers.

Although the present invention has been shown and described with respect to several preferred embodiments thereof, various changes, omissions and additions to the form and detail thereof, may be made therein, without departing from the spirit and scope of the invention.

What is claimed is:

1. A method of fabricating a semiconductor device, the method comprising the steps of:
   (a) providing a semiconductor heterostructure, the heterostructure comprising a substrate and a strained layer disposed thereover;
   (b) providing at least one sacrificial layer disposed over the strained layer;
   (c) removing at least a portion of the at least one sacrificial layer, thereby exposing a portion of the strained layer, wherein the strained layer remains intact after removal; and
   (d) providing a gate dielectric over the exposed portion of the strained layer.

2. The method of claim 1 wherein the strained layer comprises a semiconductor material selected from the group consisting of Si, Ge, and SiGe.

3. The method of claim 1 wherein the strained layer has thickness of less than about 300 angstroms.

4. The method of claim 1 wherein the strained layer is substantially free of misfit dislocations.

5. The method of claim 1 wherein the at least one sacrificial layer comprises Si or SiGe.

6. The method of claim 1 wherein step (b) comprises providing a plurality of sacrificial layers disposed over the strained layer, the plurality of sacrificial layers including at least one sacrificial layer comprising Si and at least one sacrificial layer comprising SiGe.

7. The method of claim 1 wherein the substrate comprises Si.

8. The method of claim 7 wherein the semiconductor heterostructure comprises a relaxed $Si_{1-x}Ge_x$ layer disposed between the substrate and the strained layer.

9. The method of claim 8 wherein the semiconductor heterostructure comprises a buffer layer disposed between the substrate and relaxed $Si_{1-x}Ge_x$ layer.

10. The method of claim 7 wherein the semiconductor heterostructure comprises an insulator layer disposed over the substrate, the strained layer being disposed over the insulator layer.

11. The method of claim 1 wherein at least a portion of the at least one sacrificial layer is removed using a technique selected from the group consisting of:
   wet oxidation, dry oxidation, wet etching, and dry etching.

12. The method of claim 11 wherein at least a portion of the at least one sacrificial layer is removed using the wet oxidation technique at a temperature up to about 750° C.

13. The method of claim 1 wherein step (d) comprises oxidizing at least a portion of the strained layer thereby providing the gate dielectric thereon.

14. The method of claim 1 wherein step (d) comprises depositing a dielectric layer over at least portion of the strained layer thereby providing the gate dielectric.

15. The method of claim 1 wherein step (c) comprises removing the at least one sacrificial layer.

16. The method of claim 1, further comprising processing the semiconductor heterostructure to form a MOS device at least partially over the exposed portion of the strained layer.

* * * * *